(12) United States Patent
Amanapu et al.

(10) Patent No.: US 10,204,829 B1
(45) Date of Patent: Feb. 12, 2019

(54) LOW-RESISTIVITY METALLIC INTERCONNECT STRUCTURES WITH SELF-FORMING DIFFUSION BARRIER LAYERS

(71) Applicant: International Business Machines Corporation, Armonk, NY (US)

(72) Inventors: Hari P. Amanapu, Guilderland, NY (US); Cornelius Brown Peethala, Slingerlands, NY (US); Raghuveer R. Patlolla, Guilderland, NY (US); Chih-Chao Yang, Glenmont, NY (US); Takeshi Nogami, Schenectady, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/870,213

(22) Filed: Jan. 12, 2018

(51) Int. Cl.
*H01L 21/44* (2006.01)
*H01L 21/768* (2006.01)
*H01L 23/522* (2006.01)
*H01L 23/532* (2006.01)

(52) U.S. Cl.
CPC .. *H01L 21/76858* (2013.01); *H01L 21/76802* (2013.01); *H01L 21/76843* (2013.01); *H01L 21/76865* (2013.01); *H01L 21/76873* (2013.01); *H01L 21/76879* (2013.01); *H01L 23/5226* (2013.01); *H01L 23/53238* (2013.01)

(58) Field of Classification Search
CPC ......... H01L 21/76858; H01L 21/76865; H01L 21/76879; H01L 21/76843; H01L 21/76802; H01L 21/76873; H01L 23/53238; H01L 23/5226

See application file for complete search history.

(56) References Cited

U.S. PATENT DOCUMENTS

| | | | |
|---|---|---|---|
| 6,358,832 | B1 | 3/2002 | Edelstein et al. |
| 7,304,384 | B2 | 12/2007 | Koike et al. |
| 7,816,266 | B2 | 10/2010 | Jourdan et al. |
| 8,222,134 | B2 | 7/2012 | Gordon et al. |

(Continued)

OTHER PUBLICATIONS

H. Kim et al., "Chemical Vapor Deposition (CVD) of Manganese Self-Aligned Diffusion Barriers for Cu Interconnections in Microelectronics," Proceedings of the Advanced Metallization Conference, Sep. 23-25, 2008, 9 pages.

*Primary Examiner* — Hoa (Vikki) B Trinh
(74) *Attorney, Agent, or Firm* — Vazken Alexanian; Ryan, Mason & Lewis, LLP

(57) ABSTRACT

Methods for fabricating low-resistivity metallic interconnect structures with self-forming diffusion barrier layers are provided, as well as semiconductor devices comprising low-resistivity metallic interconnect structures with self-formed diffusion barrier layers. For example, a semiconductor device includes a dielectric layer disposed on a substrate, an opening etched in the dielectric layer, a metallic liner layer covering sidewall and bottom surfaces of the opening in the dielectric layer, copper material filling the opening to form an interconnect structure, and a self-formed diffusion barrier layer formed in the sidewall surfaces of the opening of the dielectric layer. The self-formed diffusion barrier layer includes manganese atoms which are diffused into the sidewall surfaces of the dielectric layer.

13 Claims, 6 Drawing Sheets

(56) References Cited

U.S. PATENT DOCUMENTS

| | | |
|---|---|---|
| 8,969,197 B2 | 3/2015 | Edelstein et al. |
| 9,059,176 B2 * | 6/2015 | Baumann .......... H01L 23/53238 |
| 9,190,321 B2 | 11/2015 | Cabral, Jr. et al. |
| 9,514,981 B1 | 12/2016 | Badami et al. |
| 2008/0157365 A1 | 7/2008 | Ott et al. |
| 2017/0005037 A1 | 1/2017 | Liang et al. |

* cited by examiner

LOW-RESISTIVITY METALLIC INTERCONNECT STRUCTURES WITH SELF-FORMING DIFFUSION BARRIER LAYERS

TECHNICAL FIELD

This disclosure generally relates to semiconductor fabrication techniques and, in particular, techniques for fabricating metallic interconnect structures.

BACKGROUND

A semiconductor integrated circuit chip is typically fabricated with a back-end-of-line (BEOL) interconnect structure, which comprises multiple levels of metal lines and inter-level metal vias, to connect various integrated circuit components and devices that are fabricated as part of a front-end-of-line (FEOL) layer of the semiconductor integrated circuit chip. Current state of the art BEOL process technologies typically implement copper to form BEOL interconnects, as the use of copper material is known to significantly reduce resistance in the BEOL interconnect structure, resulting in improved conduction and higher performance. As copper interconnect structures are scaled down, however, there is a significant increase in the resistivity and current density within the copper interconnect structures, which is undesirable. The increase in current density in copper interconnect structures causes an increase in the current-driven electromigration of copper atoms. In the context of copper interconnect structures, electromigration is the transport of copper atoms caused by the gradual movement of ions in the copper material due to momentum transfer between conducting electrons and diffusing copper atoms. The electromigration of copper atoms can lead to various defects in copper interconnect structures such as voids and hillock defects.

Conventional metallic interconnect structures utilize copper diffusion barrier layers (e.g., tantalum nitride (TaN)) to line exposed sidewall and bottom surfaces of openings (e.g., trench openings and via openings) that are patterned in an interlevel-dielectric (ILD) prior to filling the openings with copper material. The diffusion barrier layer prevents copper from diffusing into the dielectric material of the ILD layer and damaging the BEOL structure. As copper interconnects are scaled down, however, the use of diffusion barrier layers becomes problematic.

For example, copper diffusion barrier layers must be made sufficiently thick to adequately prevent diffusion of copper atoms into the ILD layer. The required thickness of the copper diffusion barrier layer remains relatively constant as the line width of copper interconnects scales down. As such, the amount (volume) of the metal line which is composed of copper is reduced which, in turn, affects various line width-dependent characteristics such as grain structure and resistivity.

Moreover, since diffusion barrier layers are typically formed of a material (e.g., TaN) which does not sufficiently act as a wetting layer for electroplated copper, a thin seed layer is typically formed via PVD or CVD on the diffusion barrier layer prior to the copper fill. The combined thickness of the diffusion barrier layer and the seed layer can adversely affect the copper filling ability due to a further narrowing of already narrow lines. The combination of poor wetting, vertical sidewalls, and narrow trenches can result in a discontinuous seed layer coverage. Such poor seed layer coverage can lead to voids and other defects in the copper line, which in turn can weaken the adhesion between the copper interconnect and the diffusion barrier layer. Both voids and poor adhesion contribute to copper electromigration defects.

For advanced BEOL technologies, fabrication methods which replace conventional copper diffusion barrier layers with lower resistivity materials such as cobalt and ruthenium are being considered. However, the use of cobalt and ruthenium barrier/liner layers for copper interconnects can be problematic in that such materials do not provide as strong a level of adhesion to the dielectric material of the ILD layer as does conventional TaN or TiN barrier layers and, thus, the interface adhesion between a cobalt or ruthenium liner layer and the dielectric material of the ILD layer is weak. This weaker interface can lead to the formation of voids between the copper material and the ILD due to peel-off of exposed upper portions of the liner/ILD interface during a chemical-mechanical polish (CMP) process as a result of the shear mechanical forces applied to the liner/ILD interface.

SUMMARY

Embodiments of the invention include methods for fabricating low-resistivity metallic interconnect structures with self-forming diffusion barrier layers, and semiconductor devices comprising low-resistivity metallic interconnect structures with self-formed diffusion barrier layers.

One embodiment includes a method for fabricating a metallic interconnect structure. The method comprises: forming a dielectric layer on a substrate; patterning the dielectric layer to form an opening in the dielectric layer; forming a first diffusion barrier layer to cover an upper surface of the dielectric layer and sidewall and bottom surfaces of the opening in the dielectric layer; etching the first diffusion barrier layer to remove portions of the first diffusion barrier layer on the sidewall surfaces of the opening, while leaving portions of the first diffusion barrier layer on the upper surface of the dielectric layer and on the bottom surface of the opening; conformally depositing a metallic liner layer to cover exposed surfaces within the opening; conformally depositing a seed layer over the metallic liner layer, wherein the seed layer comprises a copper-manganese alloy; depositing a layer of copper material to fill the opening with copper material; and performing a thermal anneal treatment to cause manganese atoms of the seed layer to diffuse into the sidewall surfaces of the opening in the dielectric layer to form an embedded barrier diffusion layer which is embedded within the sidewall surfaces.

In another embodiment, the method further comprises: performing a CMP process to remove overburden portions of the layer of copper material, the seed layer, and the metallic liner layer, down to the portion of the first diffusion barrier layer on the upper surface of the dielectric layer; recessing upper surfaces of the layer of copper material, the seed layer, and the metallic liner layer down to a level of the upper surface of the dielectric layer; and performing a wet etch process to remove an overburden portion of the first diffusion barrier layer on the upper surface of the dielectric layer.

Another embodiment includes a device, which comprises: a dielectric layer disposed on a substrate; an opening etched in the dielectric layer; a metallic liner layer covering sidewall and bottom surfaces of the opening in the dielectric layer; metallic material filling the opening to form an interconnect structure; and a self-formed diffusion barrier layer formed in the sidewall surfaces of the opening of the dielectric layer, wherein the self-formed diffusion barrier layer comprises manganese atoms which are diffused into the sidewall surfaces of the dielectric layer.

Other embodiments will be described in the following detailed description of embodiments, which is to be read in conjunction with the accompanying figures.

BRIEF DESCRIPTION OF THE DRAWINGS

FIGS. 1-10 schematically illustrate a method for fabricating low-resistivity metallic interconnect structures with self-forming diffusion barrier layers, according to an embodiment of the invention, wherein:

FIG. 1 is a schematic cross-sectional side view of a semiconductor device at an intermediate stage of fabrication comprising a semiconductor substrate, a FEOL (front-end-of-line)/MOL (middle-of-line) structure formed on the semiconductor substrate, a capping layer, and a dielectric layer formed on the capping layer;

FIG. 2 is a schematic cross-sectional side view of the semiconductor device shown in FIG. 1 after patterning the dielectric layer to form an opening in the dielectric layer;

FIG. 3 is a schematic cross-sectional side view of the semiconductor device shown in FIG. 2 after forming a diffusion barrier layer over the surface of the semiconductor device to line the sidewall and bottom surfaces of the opening;

FIG. 4 is a schematic cross-sectional side view of the semiconductor device shown in FIG. 3 after etching the diffusion barrier layer to remove the diffusion barrier layer from the vertical sidewalls of the opening, while leaving a reduced thickness of the diffusion barrier layer on the surface of the dielectric layer and on the bottom surface of the opening;

FIG. 5 is a schematic cross-sectional side view of the semiconductor device shown in FIG. 4 after depositing a metallic liner layer and a seed layer to line the opening in the dielectric layer;

FIG. 6 is a schematic cross-sectional side view of the semiconductor device shown in FIG. 5 after depositing layer of metallic material to fill the opening in the dielectric layer with the metallic material;

FIG. 7 is a schematic cross-sectional side view of the semiconductor device shown in FIG. 6 after performing a thermal anneal process to create self-formed diffusion barrier layers on the vertical sidewall surfaces of the opening in the dielectric layer;

FIG. 8 is a schematic cross-sectional side view of the semiconductor device shown in FIG. 7 after performing a CMP process to planarize the surface of the semiconductor device down to the diffusion barrier layer and form a metallic interconnect structure;

FIG. 9 is a schematic cross-sectional side view of the semiconductor device shown in FIG. 8 after recessing upper surfaces of the metallic interconnect structure and the metallic liner layer; and FIG. 10 is a schematic cross-sectional side view of the semiconductor device shown in FIG. 9 after removing the overburden portion of the diffusion barrier layer on the surface of the dielectric layer.

DETAILED DESCRIPTION

Figure 1:
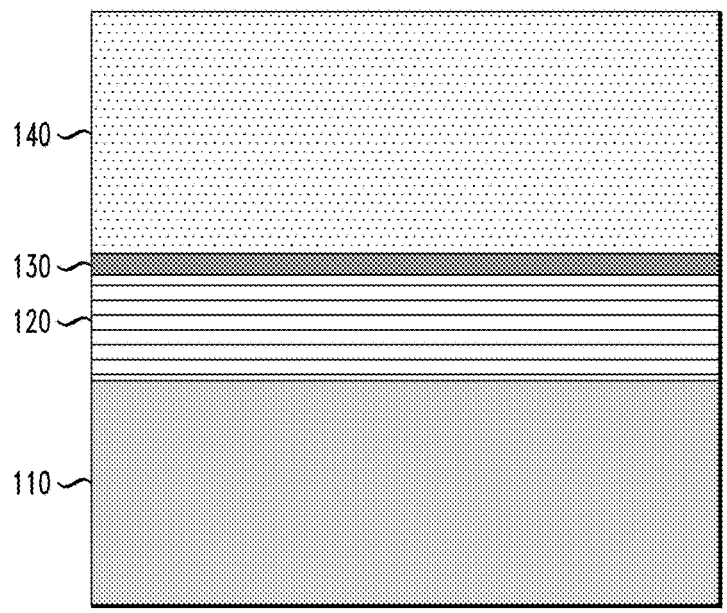

Embodiments will now be described in further detail with regard to methods for fabricating low-resistivity metallic interconnect structures with self-formed diffusion barrier layers, and semiconductor devices comprising low-resistivity metallic interconnect structures with self-formed diffusion barrier layers. It is to be understood that the various layers, structures, and regions shown in the accompanying drawings are schematic illustrations that are not drawn to scale. In addition, for ease of explanation, one or more layers, structures, and regions of a type commonly used to form semiconductor devices or structures may not be explicitly shown in a given drawing. This does not imply that any layers, structures, and regions not explicitly shown are omitted from the actual semiconductor structures. Furthermore, it is to be understood that the embodiments discussed herein are not limited to the particular materials, features, and processing steps shown and described herein. In particular, with respect to semiconductor processing steps, it is to be emphasized that the descriptions provided herein are not intended to encompass all of the processing steps that may be required to form a functional semiconductor integrated circuit device. Rather, certain processing steps that are commonly used in forming semiconductor devices, such as, for example, wet cleaning and annealing steps, are purposefully not described herein for economy of description.

Moreover, the same or similar reference numbers are used throughout the drawings to denote the same or similar features, elements, or structures, and thus, a detailed explanation of the same or similar features, elements, or structures will not be repeated for each of the drawings. It is to be understood that the terms "about" or "substantially" as used herein with regard to thicknesses, widths, percentages, ranges, etc., are meant to denote being close or approximate to, but not exactly. For example, the term "about" or "substantially" as used herein implies that a small margin of error is present, such as 1% or less than the stated amount. Further, the terms "vertical" or "vertical direction" or "vertical height" as used herein denote a Z-direction of the Cartesian coordinates shown in the drawings, and the terms "horizontal," or "horizontal direction," or "lateral" or "lateral direction" as used herein denote an X-direction and/or Y-direction of the Cartesian coordinates shown in the drawings.

Methods for fabricating low-resistivity metallic interconnect structures with self-forming diffusion barrier layers will now be discussed in further detail with reference to FIGS. 1 through 10, which schematically illustrate a semiconductor device at various stages of fabrication. To begin, FIG. 1 is a schematic cross-sectional side view of a semiconductor device 100 at an intermediate stage of fabrication comprising a semiconductor substrate 110 (e.g., semiconductor wafer), a FEOL (front-end-of-line)/MOL (middle-of-line) structure 120 formed on the semiconductor substrate 110, a capping layer 130, and a dielectric layer 140. While the semiconductor substrate 110 is illustrated as a generic substrate layer, it is to be understood that the semiconductor substrate 110 may comprise one of different types of semiconductor substrate structures and materials.

For example, in one embodiment, the semiconductor substrate 110 can be a bulk semiconductor substrate (e.g., wafer) that is formed of silicon (Si) or germanium (Ge), or other types of semiconductor substrate materials that are commonly used in bulk semiconductor fabrication processes such as a silicon-germanium alloy, compound semiconductor materials (e.g. III-V), etc. In another embodiment, the semiconductor substrate 110 may be an active semiconductor layer of an SOI (silicon-on-insulator) substrate, GeOI (germanium-on-insulator) substrate, or other type of semiconductor-on-insulator substrate, which comprises an insulating layer (e.g., oxide layer) disposed between a base substrate layer (e.g., silicon substrate) and the active semiconductor layer (e.g., Si, Ge, etc.) in which active circuit components are formed as part of the FEOL. It is to be noted that in each drawing, the X-Y plane represents a plane that is parallel to the plane of the semiconductor substrate 110 (e.g., wafer) being processed.

The FEOL/MOL structure 120 comprises a FEOL layer formed on the semiconductor substrate 110. The FEOL layer comprises various semiconductor devices and components that are formed in or on the active surface of the semiconductor substrate 110 to provide integrated circuitry for a target application. For example, the FEOL layer comprises field-effect transistor (FET) devices (such as FinFET devices, vertical FET devices, planar FET device, etc.), bipolar transistors, diodes, capacitors, inductors, resistors, isolation devices, etc., which are formed in or on the active surface of the semiconductor substrate 110. In general, FEOL processes typically include preparing the semiconductor substrate 110 (or wafer), forming isolation structures (e.g., shallow trench isolation), forming device wells, patterning gate structures, forming spacers, forming source/drain regions (e.g., via implantation), forming silicide contacts on the source/drain regions, forming stress liners, etc.

The FEOL/MOL structure 120 further comprises a MOL layer formed on the FEOL layer. In general, the MOL layer comprises a PMD (pre-metal dielectric layer) and conductive contacts (e.g., via contacts) that are formed in the PMD layer. The PMD layer is formed on the components and devices of the FEOL layer. A pattern of openings is formed in the PMD layer, and the openings are filled with a conductive material, such as tungsten, to form conducive via contacts that are in electrical contact with device terminals (e.g., source/drain regions, gate contacts, etc.) of the integrated circuitry of the FEOL layer. The conductive via contacts of the MOL layer provide electrical connections between the integrated circuitry of the FEOL layer and a first level of metallization of a BEOL structure that is formed on the FEOL/MOL structure 120.

In the example process flow illustrated in FIG. 1, the capping layer 130 and dielectric layer 140 are formed as part of an initial phase of a BEOL process module to form a first metallization level of a BEOL interconnect structure. The capping layer 130 comprises a layer of insulating/dielectric material such as silicon nitride (SiN), silicon carbide (SiC), silicon carbon nitride (SiCN), hydrogenated silicon carbide (SiCH), or a multilayer stack comprising the same or different types of dielectric materials, etc., or other suitable low-k dielectric materials which are non-reactive with the metallic material that is used to form metallic interconnect structures in the BEOL. In one example embodiment, the capping layer 130 is formed with a thickness in a range of about 2 nm to about 60 nm.

The dielectric layer 140 is formed of any suitable dielectric material that is commonly utilized as an interlevel-dielectric (ILD) layer for BEOL process technologies. For example, the dielectric layer 140 can be formed of a dielectric material including, but not limited to, silicon oxide ($SiO_2$), silicon nitride (e.g., ($Si_3N_4$), hydrogenated silicon carbon oxide (SiCOH), SiCH, SiCNH, or other types of silicon-based low-k dielectrics (e.g., k less than about 4.0), porous dielectrics, or known ULK (ultra-low-k) dielectric materials (with k less than about 2.5). The thickness of the dielectric layer 140 defines a vertical height (or thickness) of the metallization that is formed within the dielectric layer 140, which will vary depending on the application. For example, in one embodiment, the dielectric layer 140 is formed with a thickness in a range of about 20 nm to about 800 nm. The capping layer 130 and the dielectric layer 140 are formed using known deposition techniques, such as, for example, ALD (atomic layer deposition), CVD (chemical vapor deposition) PECVD (plasma-enhanced CVD), or PVD (physical vapor deposition), or spin-on deposition.

Figure 2:
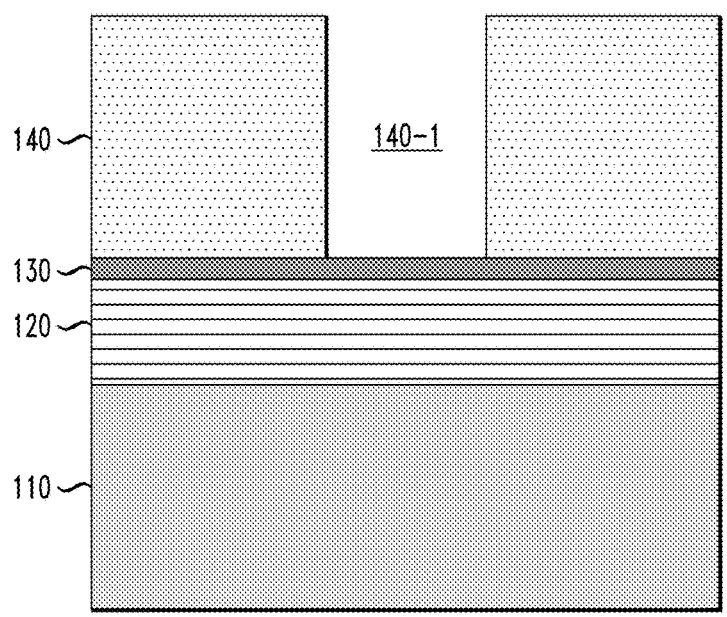

Next, FIG. 2 is a schematic cross-sectional side view of the semiconductor device shown in FIG. 1 after patterning the dielectric layer 140 to form an opening 140-1 (e.g., trench opening or via opening) in the dielectric layer 140. For illustrative purposes, FIG. 2 shows the use of a single damascene process in which metallic interconnect structures, e.g., metallic lines (wiring) and metallic vias (vertical interconnects) are separately formed in different insulating layers of a BEOL structure. In other embodiments, openings can be etched in the sacrificial dielectric layer 140 and filled with metallic material using one of various "dual" damascene patterning techniques known in the art in which trenches and via openings are patterned in the same dielectric layer and concurrently filled with metallic material. The dual damascene patterning methods include a "via first" process, a "trench first" process, and a "buried via" process, each of which comprising different sequences for etching the dielectric layer 140 to pattern the via openings and trench openings, while concurrently filling the via openings and trench openings with metallic material.

The damascene patterning of the sacrificial dielectric layer 140 can be implemented using any conventional photolithography and etching process, e.g., forming a photoresist mask on the upper surface of the sacrificial dielectric layer 140 which comprises an image of the opening 140-1 to be etched into the dielectric layer 140, followed by etching the dielectric layer 140 using a dry etch process such as RIE (reactive ion etching), which has an etch chemistry that is suitable to etch the dielectric layer 140 selective to the underlying capping layer 130 (which serves as an etch stop layer). The capping layer 130 insulates the metallization from the underlying PMD layer of the FEOL/MOL layer 120. However, in target locations where the metallization formed in the opening 140-1 will make contact to vertical contacts formed in the underlying FEOL/MOL layer 120, the capping layer 130 can be patterned by etching openings through the capping layer 130 at the bottom of the opening 140-1 at such target locations.

Figure 3:
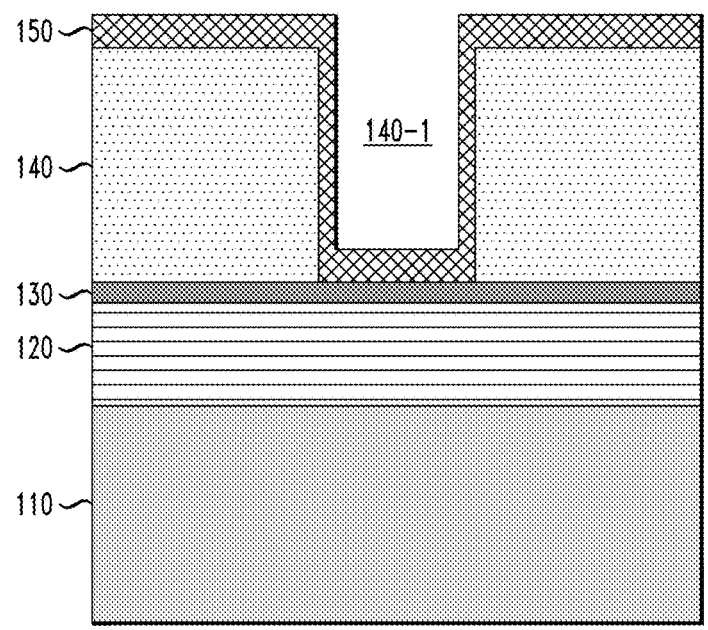

Next, FIG. 3 is a schematic cross-sectional side view of the semiconductor device shown in FIG. 2 after forming a diffusion barrier layer 150 over the surface of the semiconductor device to line the sidewall and bottom surfaces of the opening 140-1. The diffusion barrier layer 150 can be formed using materials that are commonly used as diffusion barrier layers for copper interconnects including, but not limited to, titanium (Ti), tantalum (Ta), titanium nitride (TiN), tantalum nitride (TaN), etc. In one embodiment of the invention, the diffusion barrier layer 150 is deposited using a deposition process such as PVD which results in the formation of the diffusion barrier layer 150 having a greater thickness on the field region (on surface of dielectric layer 140) and on a bottom surface of the opening 140-1, as compared to the thickness of the diffusion barrier layer 150 on the vertical sidewalls of the opening 140-1.

Figure 4:
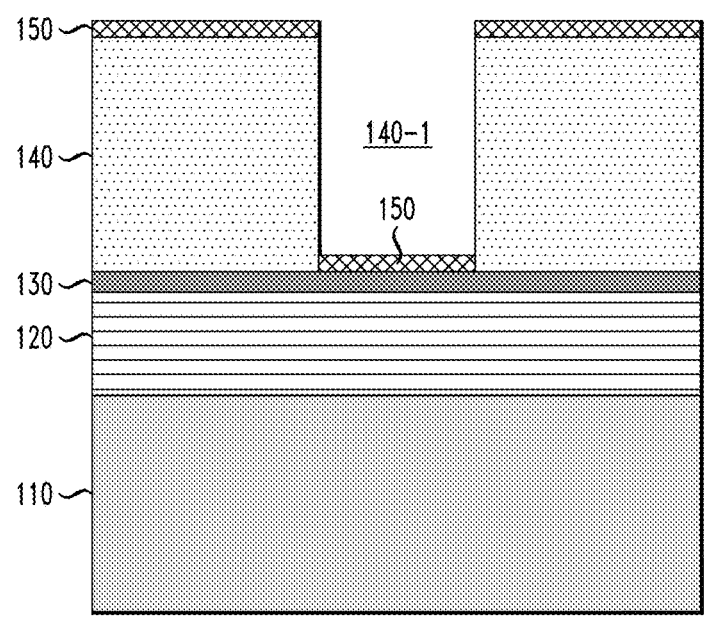

FIG. 4 is a schematic cross-sectional side view of the semiconductor device shown in FIG. 3 after etching the diffusion barrier layer 150 to remove the diffusion barrier layer 150 from the vertical sidewalls of the opening 140-1, while leaving a reduced thickness of the diffusion barrier layer 150 on the surface of the dielectric layer 140 and on the bottom surface of the opening 140-1. In one embodiment of the invention, the diffusion barrier layer 150 is etched using an isotropic etch process, such as a wet etch process, which has an etch chemistry that is configured to etch the diffusion barrier layer 150 selective to the dielectric layer 140. Since the vertical portions of the diffusion barrier layer 150 on the vertical sidewalls of the opening 140-1 are thinner than the lateral portions of the diffusion barrier layer 150 on the upper surface of the dielectric layer 140 and on the bottom surface of the opening 140-1, the vertical portions of the diffusion barrier layer 150 will be completely removed while some reduced thickness of lateral portions of the diffusion barrier layer 150 remain, as shown in FIG. 4. As explained in further detail below, the remaining portion of the diffusion barrier layer 150 on the bottom surface of the opening 140-1 serves as a diffusion barrier layer for a metallic interconnect structure that is formed in the opening 140-1, while the remaining portion of the diffusion barrier layer 150 on the upper surface of the dielectric layer 140 serves as a protection layer for a subsequent CMP process.

Figure 5:
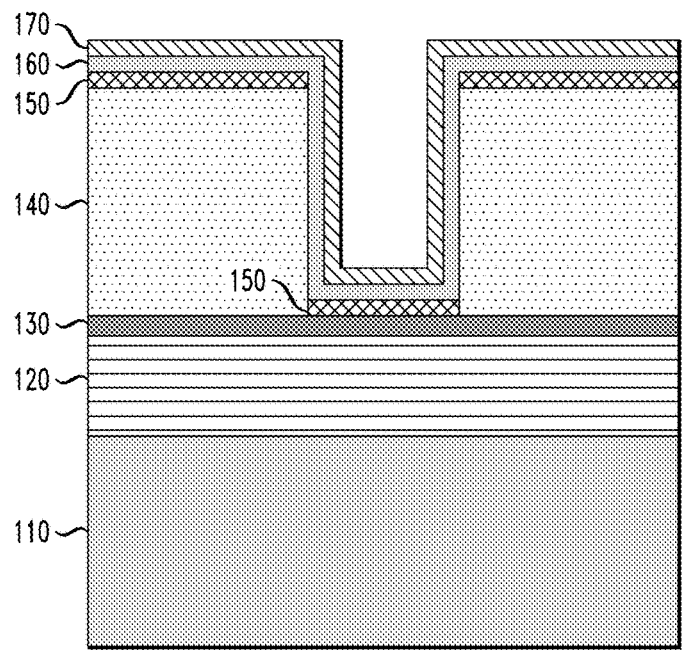

FIG. 5 is a schematic cross-sectional side view of the semiconductor device shown in FIG. 4 after depositing a metallic liner layer 160 and a seed layer 170 to line the opening 140-1. In one embodiment of the invention, the metallic liner layer 160 is formed of cobalt (Co), and the seed layer 170 is formed of a copper-manganese (CuMn) alloy. The metallic liner layer 160 serves as a wetting or adhesion layer for the deposition of the second liner layer 170. The seed layer 170 comprises a material (e.g., copper) which serves as a seed layer for a subsequent copper fill process and which forms part of the metallic interconnect structure to be formed in the opening, and a material (e.g., Manganese) which is diffused into the dielectric layer 140 to generated a self-formed barrier adhesion and diffusion layer, as discussed below.

Figure 6:
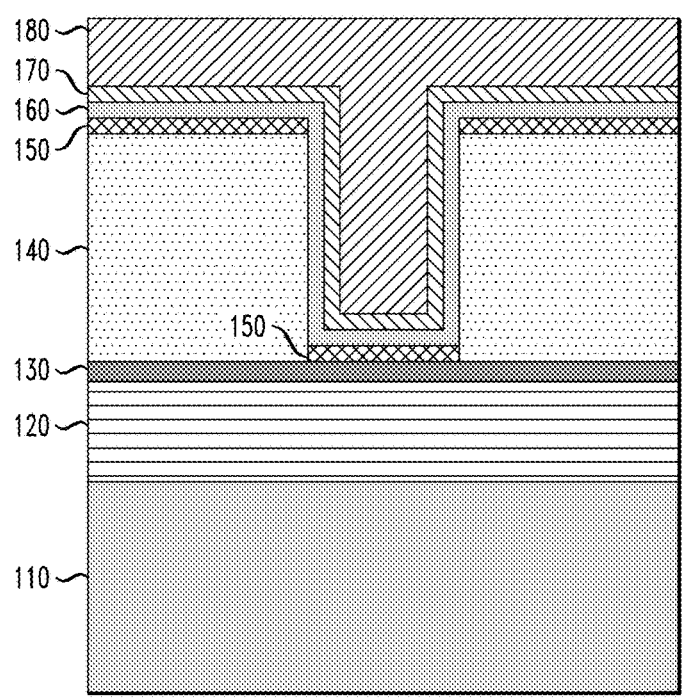

Next, FIG. 6 is a schematic cross-sectional side view of the semiconductor device shown in FIG. 5 after depositing layer of metallic material 180 to fill the opening 140-1 with metallic material. In one embodiment, the layer of metallic material 180 comprises copper, which is deposited using any suitable copper deposition method. For example, in one embodiment, the copper layer is deposited using a wet deposition technique such as electroplating.

Figure 7:
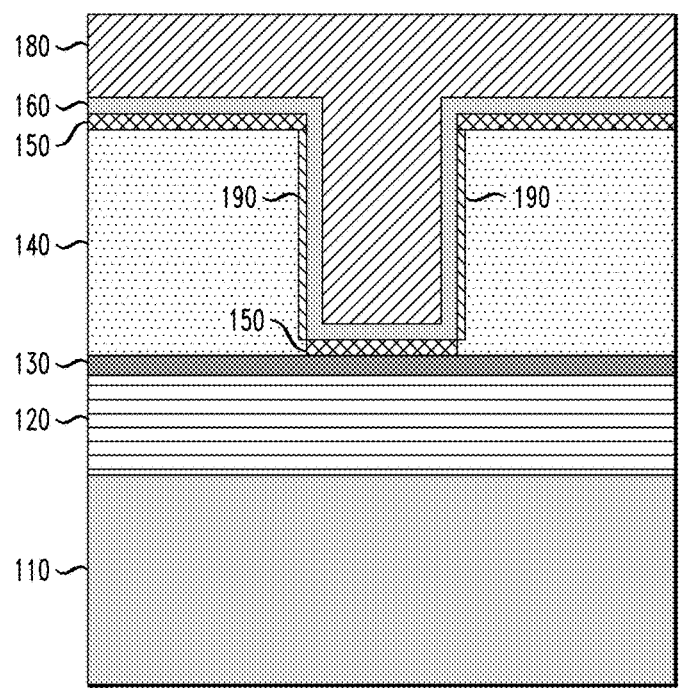

FIG. 7 is a schematic cross-sectional side view of the semiconductor device shown in FIG. 6 after performing a thermal anneal process to create self-formed diffusion barrier layers 190 on the vertical sidewalls of the dielectric layer 140. In one embodiment, a thermal anneal process is performed to cause the manganese atoms of the seed layer 170 to diffuse into the vertical sidewalls of the dielectric layer 140 and create the self-formed diffusion barrier layers 190. In one embodiment, depending on the material of the dielectric layer 140, the self-formed diffusion barrier layers 190 comprise silicon manganese (MnSi), manganese carbonate ($MnCO_3$), manganese oxide (MnO), etc. In one embodiment, the thermal anneal process is performed in a furnace at a target temperature range and for a target period of time, which is sufficient to enable diffusion of the manganese atoms of the seed layer 170 into the vertical sidewalls of the dielectric layer 140 to create the self-formed diffusion barrier layers 190. The remaining material (e.g., copper) of the seed layer 170 becomes part of the metallic material 180 (e.g., copper) that fills the opening 140-1 to form a metallic interconnect structure.

Figure 8:
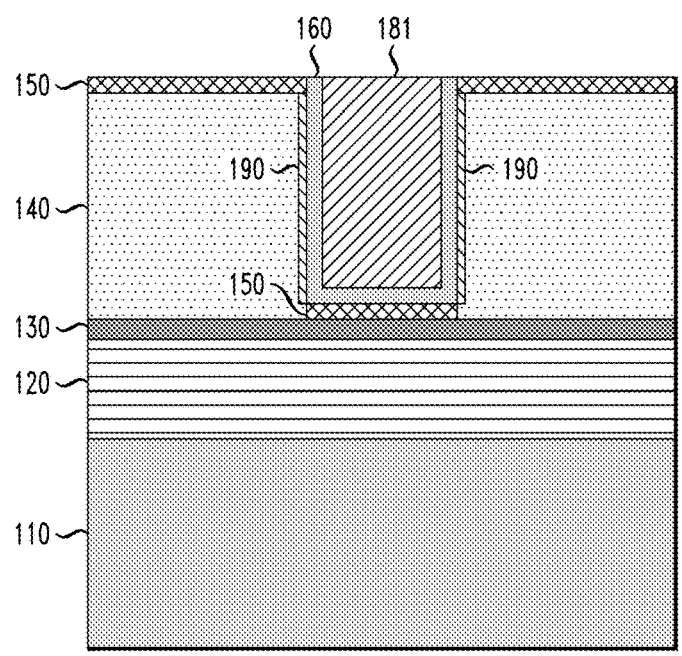

Following the thermal anneal process, a CMP process is performed on the semiconductor structure of FIG. 7 to planarize the surface of the semiconductor structure down to the diffusion barrier layer 150 to form a metallic interconnect 181 (e.g., copper interconnect), resulting in the semiconductor structure shown in FIG. 8. In this embodiment, the interface between the diffusion barrier layer 150 and the upper portion of the metallic liner layer 160 (e.g., cobalt layer) provides sufficient adhesion to the dielectric layer 140 to avoid the formation of voids (due to peel-off) between the metallic interconnect 181 and the dielectric layer 140, which can occur due to the mechanical shear forces applied to the surface of the semiconductor structure by the CMP process. The diffusion barrier layer 150 provides sufficient adhesion to the upper surface of the dielectric layer 140 and the upper portion of the metallic liner layer 160 to prevent peel-off of any portion of the upper surface of the dielectric layer 140 and the upper portion of the metallic liner layer 160. In addition, the diffusion barrier layer 150 serves to protect the upper surface of the dielectric layer 140 from damage during the CMP process, which could result in time-dependent dielectric breakdown (TDDB) of the dielectric layer 140, as is understood by those of ordinary skill in the art.

Figure 9:
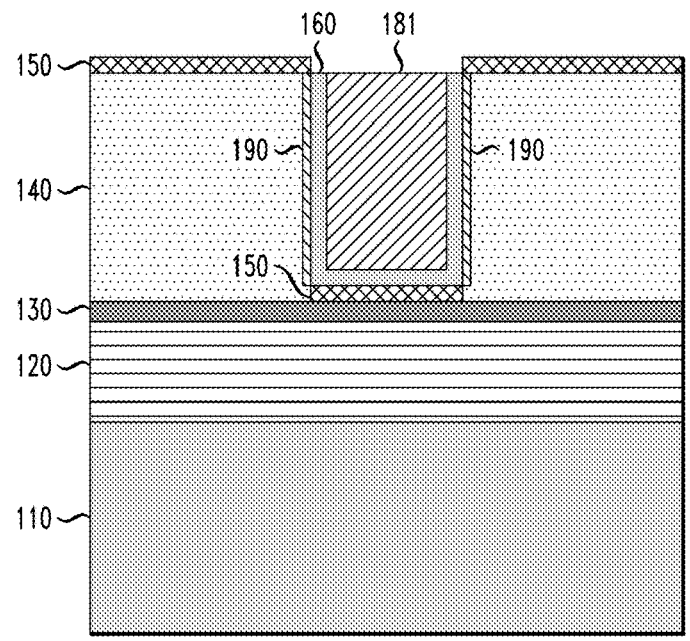

Next, FIG. 9 is a schematic cross-sectional side view of the semiconductor device shown in FIG. 8 after recessing upper surfaces of the metallic interconnect 181 and the metallic liner layer 160. In one embodiment, the upper surfaces of the metallic interconnect 181 and the metallic liner layer 160 are recessed down to a level of the upper surface of the dielectric layer 140. The recess process is implemented using a wet etch process or a CMP process, which is selective to the materials of the metallic interconnect 181 and the metallic liner layer 160 to prevent complete removal of the diffusion barrier layer 150 and, thus, protect the upper surface of the dielectric layer 140 during the recess process.

Figure 10:
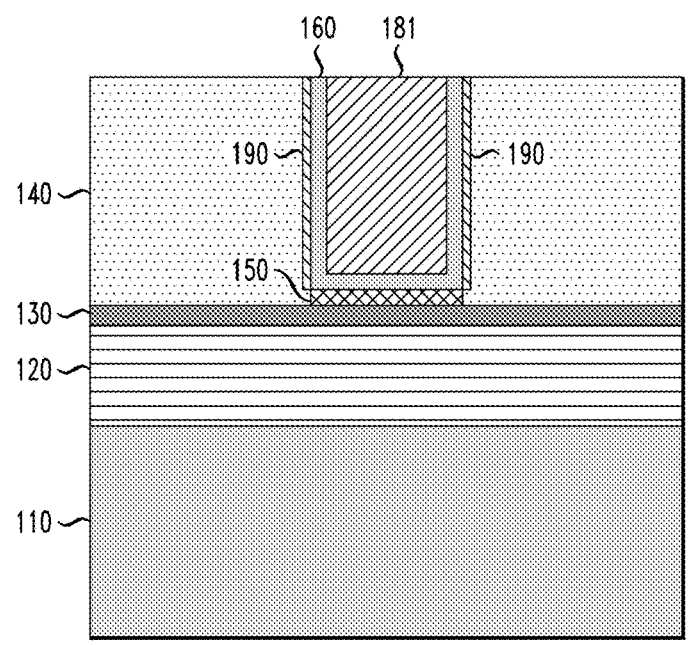

Next, FIG. 10 is a schematic cross-sectional side view of the semiconductor device shown in FIG. 9 after removing the overburden portion of the diffusion barrier layer 150 on the surface of the dielectric layer 140. In one embodiment, the overburden portion of the diffusion barrier layer 150 is removed using a wet etch process having an etch chemistry that is configured to etch the material of the diffusion barrier layer 150 selective to the material of the dielectric layer 140. The use of a wet etch process (as compared to CMP) avoids the potential of peel-off and void formation at the interface between the metallic interconnect 181 and the dielectric layer 140.

The resulting semiconductor device shown in FIG. 10 comprises a metallic interconnect structure comprising the metallic interconnect 181, the low resistance metallic liner layer 160, as well as a thin self-formed diffusion barrier layer 190 embedded in the vertical sidewalls surfaces of the dielectric layer 190 and a diffusion barrier layer 150 disposed on a bottom of the metallic interconnect structure. The metallic interconnect 181 can be a via interconnect structure, or a metallic wire (which extends in a direction orthogonal to the plane of the drawing). The thin self-formed diffusion barrier layer 190 prevents metallic material (e.g., copper) from diffusing into the dielectric layer 140, and provides a diffusion barrier layer which does not occupy volume within the opening 140-1 of the dielectric layer 140 in which the metallic interconnect structure is formed. In addition, the diffusion barrier layer 150 disposed at the bottom of the opening 140-1 serves to prevent electromigration between copper interconnect structures, while not narrowing the width of the opening 140-1, which can lead to voids when filling relatively narrow openings with metallic liners and fill material, as is known in the art.

Figure 11:
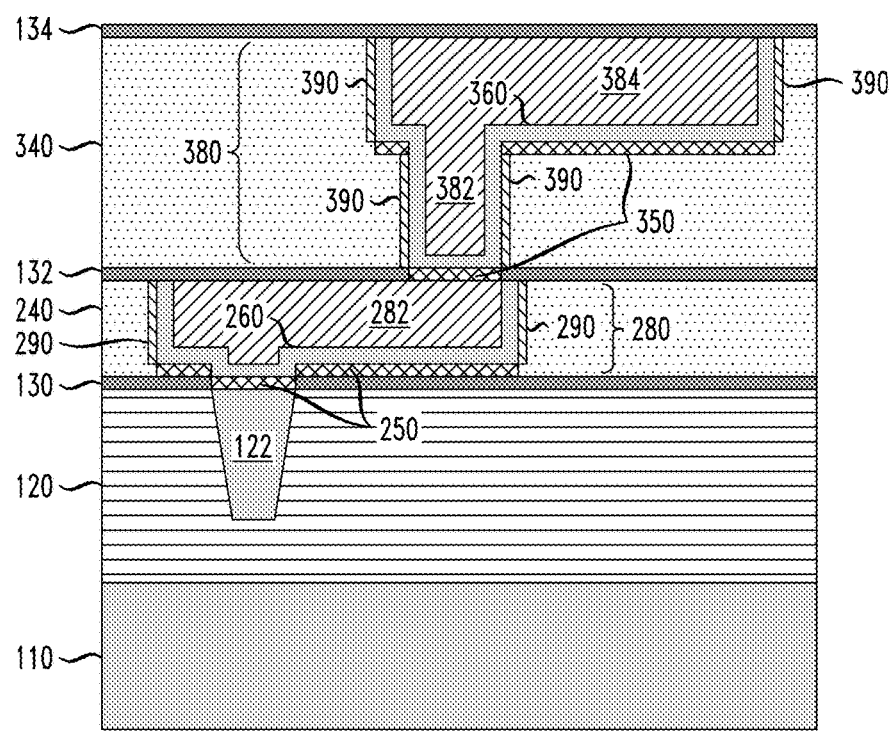
FIG. 11 is a schematic cross-sectional side view of a semiconductor device comprising low-resistivity metallic interconnect structures with self-formed diffusion barrier layers, according to embodiment of the invention.

FIG. 11 is a schematic cross-sectional side view of a semiconductor device 200 comprising low-resistivity metallic interconnect structures with self-formed diffusion barrier layers, according to embodiment of the invention. Similar to the embodiment discussed above, the semiconductor device 200 comprises a semiconductor substrate 110 (e.g., semiconductor wafer), a FEOL/MOL structure 120 formed on the semiconductor substrate 110, and a capping layer 130 formed on the FEOL/MOL structure 120. FIG. 11 further shows a MOL via 122, a first dielectric layer 240, and a first interconnect structure 280 formed in the first dielectric layer 240. The first interconnect structure 280 comprises a diffusion barrier layer 250, a metallic liner 260, a metallic wire 282, and self-formed diffusion barrier layers 290 embedded in the sidewalls of the first dielectric layer 240. The MOL via 122 is electrically connected to an end portion of the metallic wire 282 through an opening etched in the capping layer 130.

The semiconductor device 200 further comprises a capping layer 132 formed on the first dielectric layer 240 and the first interconnect structure 280, a second dielectric layer 340 formed on the capping layer 132, a second interconnect structure 380 formed in the second dielectric layer 340, and a capping layer 134 formed on the second dielectric layer 340 and the second interconnect structure 380. The second interconnect structure 380 comprises a diffusion barrier layer 350, a metallic liner 360, a metallic via 382, a metallic wire 384, and self-formed diffusion barrier layers 390 embedded in the sidewalls of the second dielectric layer 340. The metallic via 382 of the second interconnect structure 380 is electrically connected to an end portion of the metallic wire 282 through an opening etched in the capping layer 132.

FIG. 11 illustrates an example embodiment in which a single damascene process is performed to form the metallic interconnect structure 280 in the first dielectric layer 240, and a dual damascene process is performed to form the second interconnect structure 380 in the second dielectric layer 340. The interconnect structures 280 and 380 shown in FIG. 11 can be formed of the same or similar materials as the metallic interconnect structure of the semiconductor device 100 as discussed above, as well the same or similar BEOL processing flow as discussed above with reference to FIGS. 1-10.

For example, the first dielectric layer 240 is deposited over the capping layer 130, and then patterned to form a trench opening in the first dielectric layer 240 which defines an image of the metallic interconnect structure 280. A portion of the capping layer 130 at the bottom of the trench is opened to expose the upper surface of the MOL via contact 122. The diffusion barrier layer 250 is then formed by depositing a layer of diffusion barrier material, and then etching away the vertical portions of the diffusion barrier material on the sidewalls of the trench opening formed in the first dielectric layer 240. The metallic liner layer 260 (e.g., cobalt liner) and a seed layer (e.g., copper-manganese alloy) are sequentially deposited to line the trench opening in the first dielectric layer 240, followed by the deposition of a layer of metallic material (e.g., copper) to fill the trench opening and form the metallic wire 282. A thermal anneal process is then performed to cause the manganese atoms of the seed layer to diffuse into the sidewall surfaces of the trench opening in the first dielectric layer 240 to form the embedded barrier diffusion layers 290 within the sidewall surfaces of the first dielectric layer 240.

A CMP process is then performed to remove the overburden material down to the portion of the first diffusion barrier layer 250 on the upper surface of the first dielectric layer 240. The upper surfaces of the metallic wire 282 and the metallic liner layer 260 are then recessed down to a level of the upper surface of the first dielectric layer 240, and a wet etch process is performed to remove an overburden portion of the diffusion barrier layer 250 on the upper surface of the first dielectric layer 240.

The second metallic interconnect structure 280 can be formed using a similar process flow. For example, following formation of the first interconnect structure 280, the fabrication process continues with depositing layers of dielectric material to form the capping layer 132 and the second dielectric layer 340. The second dielectric layer 340 is then patterned to form a dual damascene opening comprising a via opening and a trench opening, which defines an image of the metallic via 382 and the metallic wire 384, respectively, of the second metallic interconnect structure 380. A portion of the capping layer 132 exposed at the bottom of the via opening is etched away to expose a portion of the upper surface of the metallic wire 282 of the first interconnect structure 280. The diffusion barrier layer 350 is then formed by depositing a layer of diffusion barrier material, and then etching away the vertical portions of the diffusion barrier material on the sidewalls of the via and trench openings formed in the second dielectric layer 340. The metallic liner layer 360 (e.g., cobalt liner) and a seed layer (e.g., copper-manganese alloy) are sequentially deposited to line the via and trench openings in the second dielectric layer 340, followed by depositing a layer of metallic material (e.g., copper) to fill the via and trench openings and form the metallic via 382 and the metallic wire 384. A thermal anneal process is then performed to cause the manganese atoms of the seed layer to diffuse into the sidewall surfaces of the via and trench openings in the second dielectric layer 340 to form the embedded barrier diffusion layers 390 within the sidewall surfaces of the second dielectric layer 340.

A CMP process is then performed to remove the overburden material down to the portion of the diffusion barrier layer 350 on the upper surface of the second dielectric layer 340. The upper surfaces of the metallic wire 384 and the metallic liner layer 360 are recessed down to a level of the upper surface of the second dielectric layer 340, and a wet etch process is performed to remove an overburden portion of the diffusion barrier layer 350 on the upper surface of the second dielectric layer 340. The capping layer 134 is then formed by depositing a layer of dielectric material over the resulting structure. The same or similar BEOL process flows can then be repeated to form one or more additional metallization levels of the BEOL structure.

It is to be understood that the methods discussed herein for fabricating low-resistivity metallic interconnect structures (e.g., copper BEOL interconnect structures) with self-formed diffusion barrier layers can be incorporated within semiconductor processing flows for fabricating other types of semiconductor devices and integrated circuits with various analog and digital circuitry or mixed-signal circuitry. In particular, integrated circuit dies can be fabricated with various devices such as field-effect transistors, bipolar transistors, metal-oxide-semiconductor transistors, diodes, capacitors, inductors, etc. An integrated circuit in accordance with the present invention can be employed in applications, hardware, and/or electronic systems. Suitable hardware and systems for implementing the invention may include, but are not limited to, personal computers, communication networks, electronic commerce systems, portable communications devices (e.g., cell phones), solid-state media storage devices, functional circuitry, etc. Systems and hardware incorporating such integrated circuits are considered part of the embodiments described herein. Given the teachings of the invention provided herein, one of ordinary skill in the art will be able to contemplate other implementations and applications of the techniques of the invention.

Although exemplary embodiments have been described herein with reference to the accompanying figures, it is to be understood that the invention is not limited to those precise embodiments, and that various other changes and modifications may be made therein by one skilled in the art without departing from the scope of the appended claims.

We claim:

1. A method, comprising:
    forming a dielectric layer on a substrate;
    patterning the dielectric layer to form an opening in the dielectric layer;
    forming a first diffusion barrier layer to cover an upper surface of the dielectric layer and sidewall and bottom surfaces of the opening in the dielectric layer;
    etching the first diffusion barrier layer to remove portions of the first diffusion barrier layer on the sidewall surfaces of the opening, while leaving portions of the first diffusion barrier layer on the upper surface of the dielectric layer and on the bottom surface of the opening;
    conformally depositing a metallic liner layer to cover exposed surfaces within the opening;
    conformally depositing a seed layer over the metallic liner layer, wherein the seed layer comprises a copper-manganese alloy;
    depositing a layer of copper material to fill the opening with copper material; and
    performing a thermal anneal treatment to cause manganese atoms of the seed layer to diffuse into the sidewall surfaces of the opening in the dielectric layer to form an embedded barrier diffusion layer which is embedded within the sidewall surfaces.

2. The method of claim 1, wherein the first diffusion barrier layer comprises one of tantalum (Ta), tantalum nitride (TaN), titanium (Ti), and titanium nitride (TiN).

3. The method of claim 1, wherein the embedded barrier diffusion layer comprises one of silicon manganese, manganese carbonate, and manganese oxide.

4. The method of claim 1, wherein the metallic liner layer comprises cobalt.

5. The method of claim 1, wherein forming the first diffusion barrier layer comprises depositing the first diffusion barrier layer using a deposition process which is configured to form the diffusion barrier layer with a greater thickness on the upper surface of dielectric layer and on the bottom surface of the opening, as compared to a thickness of the diffusion barrier layer on the sidewalls of the opening.

6. The method of claim 5, wherein etching the first diffusion barrier layer to remove portions of the first diffusion barrier layer on the sidewall surfaces of the opening, while leaving portions of the first diffusion barrier layer on the upper surface of the dielectric layer and on the bottom surface of the opening is performed using a wet etch process.

7. The method of claim 1, further comprising:
    performing a chemical-mechanical planarizing (CMP) process to remove overburden portions of the layer of copper material, the seed layer, and the metallic liner layer, down to the portion of the first diffusion barrier layer on the upper surface of the dielectric layer;
    recessing upper surfaces of the layer of copper material, the seed layer, and the metallic liner layer down to a level of the upper surface of the dielectric layer; and
    performing a wet etch process to remove an overburden portion of the first diffusion barrier layer on the upper surface of the dielectric layer.

8. The method of claim 7, wherein recessing the upper surfaces of the layer of copper material, the seed layer, and the metallic liner layer down to a level of the upper surface of the dielectric layer is performed using one or more wet etch processes.

9. The method of claim 7, wherein recessing the upper surfaces of the layer of copper material, the seed layer, and the metallic liner layer down to a level of the upper surface of the dielectric layer is performed using a CMP process.

10. The method of claim 1, wherein the dielectric layer comprises an interlayer dielectric (ILD) layer of a back-end-of-line (BEOL) structure.

11. The method of claim 1, wherein the opening in the dielectric layer comprises a via opening which defines a via interconnect.

12. The method of claim 1, wherein the opening in the dielectric layer comprises a trench opening which defines a wire interconnect.

13. The method of claim 1, wherein the opening in the dielectric layer comprises a dual damascene opening which comprises a via opening and a trench opening disposed above the via opening.

* * * * *